(12) United States Patent
Swaminathan et al.

(10) Patent No.: US 11,086,843 B2
(45) Date of Patent: Aug. 10, 2021

(54) EMBEDDING CODEBOOKS FOR RESOURCE OPTIMIZATION

(71) Applicant: ADOBE INC., San Jose, CA (US)

(72) Inventors: Viswanathan Swaminathan, Saratoga, CA (US); Saayan Mitra, San Jose, CA (US)

(73) Assignee: ADOBE INC., San Jose, CA (US)

( * ) Notice: Subject to any disclaimer, the term of this patent is extended or adjusted under 35 U.S.C. 154(b) by 651 days.

(21) Appl. No.: 15/788,481

(22) Filed: Oct. 19, 2017

(65) Prior Publication Data
US 2019/0121884 A1 Apr. 25, 2019

(51) Int. Cl.
| | |
|---|---|
| *G06F 16/00* | (2019.01) |
| *G06F 16/23* | (2019.01) |
| *G06F 16/583* | (2019.01) |
| *H04N 21/6336* | (2011.01) |
| *H03M 7/30* | (2006.01) |
| *H04N 21/21* | (2011.01) |

(52) U.S. Cl.
CPC ...... *G06F 16/2365* (2019.01); *G06F 16/5862* (2019.01); *H03M 7/30* (2013.01); *H03M 7/6088* (2013.01); *H04N 21/21* (2013.01); *H04N 21/6336* (2013.01)

(58) Field of Classification Search
CPC ... G06F 21/10; G06F 21/36; G06F 2221/0737
See application file for complete search history.

(56) References Cited

U.S. PATENT DOCUMENTS

| | | | |
|---|---|---|---|
| 5,488,365 | A | 1/1996 | Seroussi et al. |
| 5,563,593 | A | 10/1996 | Puri |
| 5,684,865 | A | 11/1997 | Mohtashemi et al. |
| 5,717,951 | A | 2/1998 | Yabumoto |
| 5,909,693 | A | 6/1999 | Martini |
| 6,378,031 | B1 | 4/2002 | Kuno et al. |
| 6,421,467 | B1 | 7/2002 | Mitra |
| 6,717,990 | B1 | 4/2004 | Abousleman |

(Continued)

OTHER PUBLICATIONS

Pre-Interview First Office Action dated Dec. 2, 2019 in U.S. Appl. No. 15/788,146. 4 pages.

(Continued)

*Primary Examiner* — Yicun Wu
(74) *Attorney, Agent, or Firm* — Shook, Hardy & Bacon L.L.P.

(57) ABSTRACT

Embodiments of the present disclosure provide systems, methods, and computer storage media for optimizing computing resources generally associated with cloud-based media services. Instead of decoding digital assets on-premises to stream to a remote client device, an encoded asset can be streamed to the remote client device. A codebook employable for decoding the encoded asset can be embedded into the stream transmitted to the remote client device, so that the remote client device can extract the embedded codebook, and employ the extracted codebook to decode the encoded asset locally. In this way, not only are processing resources associated with on-premises decoding eliminated, but on-premises storage of codebooks can be significantly reduced, while expensive bandwidth is freed up by virtue of transmitting a smaller quantity of data from the cloud to the remote client device.

19 Claims, 8 Drawing Sheets

(56) References Cited

U.S. PATENT DOCUMENTS

| | | | |
|---|---|---|---|
| 6,993,536 | B2 | 1/2006 | Yamanaka |
| 7,009,949 | B1* | 3/2006 | Gopalakrishnan .... H04L 1/0002 370/236 |
| 7,613,738 | B2 | 11/2009 | Patel et al. |
| 7,630,902 | B2 | 12/2009 | You |
| 7,831,130 | B2 | 11/2010 | Takada |
| 8,185,924 | B2 | 5/2012 | Kikkoji et al. |
| 8,392,705 | B2 | 3/2013 | Borden et al. |
| 9,064,161 | B1 | 6/2015 | Boman et al. |
| 9,281,838 | B1 | 3/2016 | Whillock et al. |
| 9,591,334 | B2 | 3/2017 | Swaminathan et al. |
| 9,727,234 | B2 | 8/2017 | Negron et al. |
| 9,972,325 | B2 | 5/2018 | Gao |
| 2003/0103667 | A1 | 6/2003 | Soliman |
| 2003/0147561 | A1 | 8/2003 | Faibish et al. |
| 2004/0001408 | A1 | 1/2004 | Propps et al. |
| 2004/0174278 | A1 | 9/2004 | Kadono et al. |
| 2005/0071744 | A1 | 3/2005 | Dunbar et al. |
| 2005/0114290 | A1 | 5/2005 | Borthakur et al. |
| 2005/0132161 | A1 | 6/2005 | Makela et al. |
| 2008/0031601 | A1 | 2/2008 | Hashimoto et al. |
| 2010/0138393 | A1 | 6/2010 | Crescenti et al. |
| 2010/0138396 | A1 | 6/2010 | Kikkawa |
| 2011/0006931 | A1* | 1/2011 | Sun .................. H03M 7/425 341/65 |
| 2011/0087768 | A1* | 4/2011 | Wu .................. H04L 1/0009 709/224 |
| 2014/0258652 | A1 | 9/2014 | Vishniac et al. |
| 2015/0332690 | A1 | 11/2015 | Kim et al. |
| 2016/0019898 | A1 | 1/2016 | Schreiner et al. |
| 2016/0065961 | A1 | 3/2016 | Whillock et al. |
| 2016/0156940 | A1 | 6/2016 | Swaminathan et al. |
| 2017/0063392 | A1 | 3/2017 | Kalevo et al. |
| 2017/0155906 | A1 | 6/2017 | Puri |

OTHER PUBLICATIONS

Non-Final Office Action dated Sep. 6, 2017 in U.S. Appl. No. 14/964,715, 10 pages.

Blelloch, Guy E., "Introduction to Data Compression," Computer Science Department, Carnegie Mellon University, Jan. 31, 2013. 55 pages.

Blelloch, Guy, "Algorithms in the Real World: Lecture Notes (Fall1997)," Apr. 23, 1998. 303 pages.

Shah Bahram I, et al., "Evaluation of Huffman and Arithmetic Algorithms for Multimedia Compression Standards," Retrieved from the Internet—Nov. 1, 2015. URL:htlp://arxiv.org/flp/arxiv/papers/1109111 09.02.6.pdf. 11 pages.

Wagner, David, "CS 170: Efficient Algorithms and Intractable Problems," Handout 16, UC Berkeley, Apr. 1, 2003. 4 pages.

First Action Interview Office Action dated Apr. 20, 2020 in U.S. Appl. No. 15/788,146.

Chen, H.N., et al.,"Improved Adaptive Vector Quantization Algorithm Using Hybrid Codebook Data Structure", Real-Time Imaging 11, pp. 270-281, (Jun. 9, 2005). Available online at www.sciencedirect.com.

Lu, Z.M., et al., "Dynamically Restricted Codebook-Based Vector Quantisation Scheme for Mesh Geometry Compression", SlViP 2, pp. 251-260 (2008).

Zhang, C., et al. "Beyond Explicit Codebook Generation: Visual Representation Using Implicitly Transferred Codebooks", IEEE Transactions on Image Processing, vol. 24, No. 12, pp. 5777-5788 (Dec. 2015).

Notice of Allowance dated Nov. 4, 2020 in U.S. Appl. No. 15/788,146, 9 pages.

Preinterview First Office Action dated Dec. 14, 2020 in U.S. Appl. No. 15/788,455,17 pages.

Notice of Allowance dated May 12, 2021 in U.S. Appl. No. 15/788,455, 8 pages.

* cited by examiner

EMBEDDING CODEBOOKS FOR RESOURCE OPTIMIZATION

CROSS-REFERENCE TO RELATED APPLICATIONS

This application is related by subject matter to and has the same priority date as U.S. Non-Provisional patent application Ser. No. 15/788,146, entitled "LATENCY OPTIMIZATION FOR DIGITAL ASSET COMPRESSION," and U.S. Non-Provisional patent application Ser. No. 15/788,455, entitled "LATENCY MITIGATION FOR ENCODING DATA," each assigned or under obligation of assignment to the same entity as this application, the entire digital assets of each being incorporated by reference herein. This application is also related by subject matter to U.S. Pat. No. 9,277,234, filed Aug. 27, 2014, U.S. Pat. No. 9,281,838, filed Feb. 11, 2015, and U.S. Pat. No. 9,591,334, filed Jan. 20, 2016, each entitled "COMMON COPY COMPRESSION" and assigned or under obligation of assignment to the same entity as this application, the entire contents of each being herein incorporated by reference.

BACKGROUND

Consumer access to digital media has progressively moved towards server-based storage solutions, otherwise known as the "cloud." Consumers benefit from having a single access point for storing and accessing digital media because they are no longer required to maintain separate copies of the digital media over multiple devices. Cloud service providers, however, must maintain and distribute the digital media for each licensed consumer. As cloud-based solutions become ubiquitous, so do the complexities of hosting and processing massive amounts of data. More specifically, the intricacies associated with hosting multitudes of digital media copies, while staying within the parameters of copyright laws and digital media licensing requirements, present new and unforeseen technical challenges. More specifically, the processing demands associated with hosting large quantities of digital media can be resource intensive, with processing demands continuously increasing in accordance with the rapidly-increasing numbers and sizes of digital media files. A failure to keep up with the increasing processing demands, such as those associated with encoding and decoding, introduces undesirable strain on cloud-based systems. The described legal and technical challenges together introduces a new array of problems that cloud-service providers need to address effectively.

SUMMARY

Embodiments of the present disclosure relate to data compression and resource optimization. More specifically, systems and methods are disclosed relating to the optimization of computing resources, such as storage space and processing power, by embedding codebooks into communications to a remote device. As codebooks are required in various compression applications to decode encoded content, offloading of codebooks to the remote device—so that the remote device can decode the encoded content with the communicated codebook—facilitates an optimization of computing resources on the server side.

In an embodiment, a codebook that can be employed to decode an encoded digital asset is generated by a server. The server can initialize one or more channels of communication with a remote client device to facilitate streaming transmissions of one or more respective digital assets. Rather than streaming decoded content for direct viewing by the remote client device, the server streams the encoded content, so that the remote client device can decode and present the content locally. The server can communicate the codebook to the remote client device in various ways.

In one aspect, the codebook can be embedded into the encoded content itself, which is streamed to the remote client device via one of the channels of communication. In another aspect, the codebook can be embedded into one or more streaming transmissions via one or more respective channels of communication. More importantly, the remote client device can receive, extract, and employ the embedded codebook from either the encoded content or the streaming transmission, to locally decode the content for presentation thereon.

In another aspect, one or more pieces of encoded content can be stored at the server for each client device, such that the server also stores an associated codebook for the one or more pieces of encoded content. In this regard, a unique codebook may be stored at the server not only to comply with jurisdictional rules, if applicable, but to also optimize codebook generation processes tailored to each client device (e.g., codebooks generated based on usage history and/or user preferences). To this end, codebook generation and storage can differ among various implementations based on service provider needs and/or jurisdictional limitations. By way of example, a codebook for one or more pieces of encoded content can be stored on the server for each client or the codebook can be embedded into and/or streamed with one or more pieces of encoded content to each client for storage thereon.

In another embodiment, a client device can initialize one or more channels of communication with a remote server device to facilitate a receipt of streaming transmissions including one or more respective digital assets. The client device receives, via a selected channel of communication, encoded content that cannot be directly viewed by the client device. The client content can, however, reconstruct a codebook based on embedded codebook data that is extracted either from the encoded content itself or from one or more streaming transmissions received via one or more respective channels of communication. In one aspect, the embedded codebook data can be a codebook that is employable to decode transmitted encoded content. In another aspect, the embedded codebook data can be a modification to a codebook that is already stored local to the client device. More importantly, the client device can reconstruct a codebook based on the extracted codebook data to locally decode the content for presentation thereon.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present disclosure is described in detail below with reference to the attached drawing figures, wherein.

DETAILED DESCRIPTION

Figure 1:
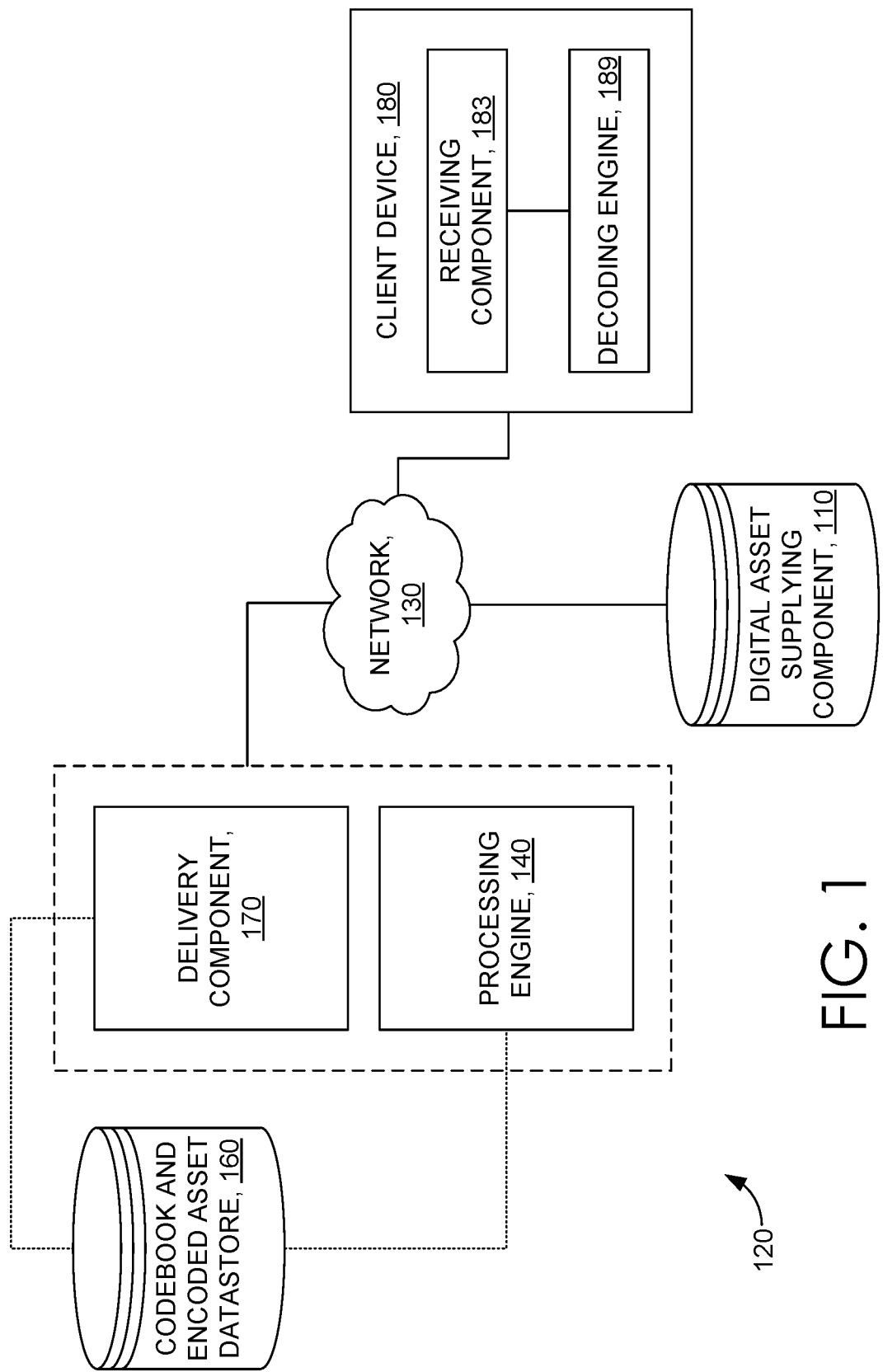
FIG. 1 depicts an exemplary operating environment including a delivery component and a receiving component in accordance with some embodiments of the present disclosure.

As digital data storage moves aggressively toward server-based "cloud" solutions, digital media service providers have harnessed the benefits of cloud-based storage solutions, providing consumers with single point-of-access storage solutions to store and access digital assets. Cloud-based digital media solutions can offer features such as cloud-based television, digital video recording (DVR), movie rental, streaming radio, podcasts, etc., all of which can be provided to multiple users at any given moment. The ever-increasing demand for cloud-based digital asset storage and access results in new technical complexities that service providers must address in efforts to stay ahead of the storage space requirements curve.

Some conventional systems employ specialized compression algorithms, such as vector quantization, which can process (e.g., analyze) a digital asset in such a manner that a codebook is trained based on the digital asset. More specifically, such systems can analyze a digital asset, select various vectors of the digital asset, and map them into a finite set of vectors called a codebook. In this way, compression can be achieved. The trained codebook can later be employed to decode (i.e., reconstruct) the digital asset. The trained codebook can also provide further utility—it can be immediately employed to more efficiently encode additional "substantially similar" copies of the digital asset. That is, other digital assets having the same content and/or similar characteristics (e.g., content, genre, resolution, bitrate, color scheme, etc.) can also be encoded with the same codebook.

Though this method of compression provides significant cost savings and other benefits to cloud-based media service providers, the encoding and decoding processes, among other things, weigh heavily on system resources (e.g., processing, storage, etc.), particularly in the live streaming context. Moreover, encoded assets and codebooks, although together smaller than digital assets prior to encoding, still consume storage space. Further, when a digital asset is decoded on-premises (e.g., the server side) and transmitted off-premises (e.g., to a client device) for consumption, the decoded content consumes expensive bandwidth by virtue of its generally larger file size.

Embodiments of the present disclosure provide, among other things, techniques that optimize resource consumption of networked media servers that provide one or more viewable "channels" that can be remotely accessed by client devices. The described optimization techniques can be facilitated by offloading resource-intensive decoding tasks to the clients. More particularly, the described techniques provide significant savings on processing resources necessary to decode encoded assets, storage capacity requirements to store codebooks, and bandwidth consumption when streaming decompressed digital assets. By processing one or more digital assets to train a single codebook that is communicated to the client device(s), and embedding the codebook into communications transmitted to client devices capable of decoding the one or more encoded digital assets, media servers can optimize resource consumption by off-loading the expensive decoding processes off-premises. As a result, though various implementations may differ, the server no longer requires that every codebook be stored thereon, does not need to expend processing resources to decode encoded content, and does not need to transmit high bandwidth-consuming content to facilitate an enjoyable media consuming experience.

When delivering an encoded digital asset in addition to a codebook to a client device, providers may consider various techniques for generating and offloading codebooks to a client-side decoder for decoding thereon. In one aspect, a codebook is generated based on variations of the same content (e.g., program, show, movie), or in other words, the codebook is trained based on various representations (e.g., resolutions, bitrates, encoding types, etc.) of the same content. The generated codebook is embedded into the stream transmitted to the client device off-premises, so that the client-side decoder can decode the content, and in some instances, switch between the various representations without requiring a different codebook.

In another aspect, a codebook is generated based on a variety of similar content (e.g., multiple baseball games) having common asset characteristics (e.g., content, content genre, content source, resolution, bitrate, encoding type, encoding source, entropy coding scheme, compression type, codec, motion vectors, group of pictures, sequence structure, associated channel, frame relationship, asset name). A codebook such as this can be generated and embedded into a stream of any digital asset having these common characteristics, so that when received by the client-side decoder, the codebook can be employed accordingly to decode the encoded digital asset. In this latter configuration, compression rates are generally not as efficient as the former configuration. However, by streaming the codebook over a longer duration of time (e.g., amortized over a longer period of time), lower compression rates can still be satisfactorily achieved.

Various terms are used throughout this description. Although more details regarding various terms are provided throughout this description, general definitions of some terms are included below to provider a clearer understanding of the ideas disclosed herein:

As used herein, a "digital asset" generally refers to an electronic data file. In some cases, a digital asset can be a media file or media stream, such as an image, video, and/or audio file or stream. In other cases, a digital asset can be a data file, application, game, or any other digital data file or stream. A digital asset can include presentations (e.g., media) licensed or owned by any number of users. For instance, the digital asset can be a digital recording or stream of a television show or movie.

A digital asset can have any number of "asset characteristics" associated therewith. An asset characteristic of a digital asset can include any characteristic of the digital asset file, the digital asset metadata, or the digital asset content. By way of example only, a digital asset file can have a file name, an extension, or any other identifiable characteristics. In another example, the digital asset metadata can reference content genre, content type (e.g., category, rating), content title, content source (e.g., place of origin), resolution, bitrate, encoding type, encoding source (e.g., software, hardware), entropy coding scheme, compression type, codec, source channel (e.g., streaming source), and the like. Further, the digital asset content can include determinable characteristics, such as a motion vector schema, a discrete cosine transform (DCT) coefficient, additional metadata, and the like. It is contemplated that the digital asset file, metadata, and content can include any one or more of the identifiable or determinable characteristics described above in a non-limiting manner, including those not described herein.

As used herein, "training" a codebook based on data (e.g., a digital asset) is the process of applying a specific code or algorithm to the data for conversion. In some cases, the process of training a codebook can include an encoding process—generating smaller identifiable data pieces from a digital asset. The data pieces can be individually unique (e.g., index files, residual files) and/or commonly used by other data pieces (e.g., a codebook). In other cases, training can include parsing or extracting a common data piece (e.g., a codebook) and a plurality of unique data pieces (e.g., index files, residual files), both the common and unique data pieces being smaller in size than the original digital asset. In some other cases, training can also generate, parse out, or extract a residual data piece for each digital asset.

As used herein, "encoding," also known as compression, refers to the process of modifying or converting the bits structure of data in such a way that it consumes less space on disk. In some cases, compression can be lossless, such that no information is discarded as a result of the compression algorithm used when encoding. In other cases, compression can be lossy, such that the algorithm looks for recurring patterns in a data file and permanently replaces occurrences of the recurring pattern portions with short abbreviations, thereby reducing the file size. When a lossy file is uncompressed, however, only a part of the original information remains. Depending on an acceptable rate of loss, a trade-off must be made between file size and media quality. In various embodiments, a codebook trained from an asset can be employed to encode additional copies of the asset, or in some cases, different assets having similar content characteristics.

As used herein, "compression" refers to the process of modifying, encoding, and/or converting the bit structure of data in such a way that it consumes less space on disk. In some cases, compression can be lossless, such that no information is discarded as a result of the compression algorithm used when encoding. In other cases, compression can be lossy, such that the algorithm can look for recurring patterns in a data file and replace occurrences of the recurring pattern portions with short abbreviations, thereby reducing the file size.

On the other hand, "decoding" is the reverse process of encoding. Decoding converts encoded data back to its original state. In other words, the process of decoding reconstructs a data file (e.g., a digital asset) by merging together smaller identifiable portions (also referred to herein as "reconstructing"). The portions from which the data file is reconstructed can be individually unique and/or commonly used by other portions. In some embodiments, data that was encoded based on a codebook can also be decompressed with reference to the codebook.

A "codebook" generally refers to a set of parameters used to decode data, and in some instances, facilitate the encoding (e.g., compressing) of data. In more detail, the codebook is a collection of parameters, also known as codewords. A codeword refers to a codebook vector determined to be the closest vector in Euclidean distance from the input vector. The codebook can be used to reference the portion of a digital asset that is common to a plurality of index files. As will be described, the codebook can be used with a corresponding index file for decoding and reconstructing the digital asset. However, in some implementations, such as vector quantization by way of example, a codebook can be used for data compression.

As used herein, "extracting" refers to the process of separating portions of data from a plurality of digital assets based on similarities and/or differences between the digital assets. On a very high level, extraction can be performed by comparing each copy to one another to determine the commonalities there between, followed by dissecting the common portions from each copy to determine and generate a common data piece. As such, the remaining portions from each copy remain as the individual data piece. In some other aspects, extraction can be performed by recursive algorithms, which extract and build portions of index files, as digital assets are compared to one another. As such, after recursively traversing through each digital asset, a codebook can be trained as a result of the comparison and extraction process. Other algorithms and processes for generating codebooks and index files are considered within the scope of the present disclosure.

"Vector quantization" is a process of encoding (i.e., compressing) a digital asset into smaller data portions. More particularly, the process encodes a large set of input vectors by finding a smaller set of representative codebook vectors that provide an approximation to the original input space. In some cases, representative codebook vectors can be determined using a nearest neighbor condition, where the encoding region should consist of all vectors that are closer to a particular codebook vector than any other codebook vector. In some other cases, representative codebook vectors can be determined based on a centroid condition, where a particular codebook vector should be the average of all vectors that are in an encoding region. In various embodiments, the determination of representative codebook vectors utilizing the nearest neighbor condition and the centroid conditions can be made in an alternating manner. In some instances, Vector quantization can encode data to compress data into smaller portions (e.g., a codebook and an index file), where a sum of the smaller portions is less than a size of the data prior to encoding.

An "index file" generally refers to a collection of indices for referencing the codebook. In more detail, the index file includes codeword indices that offer the lowest amount of distortion. The index file can be used to represent a single copy of a digital asset. In some implementations, the index file can be used with a codebook to decode and reconstruct the digital asset.

A "residual error" refers to portions of the digital asset input vectors that potentially may not be stored in the codebook as a result of input vector decomposition during vector quantization. In some implementations, residual errors can still be used with a codebook and an index file to decode and reconstruct a digital asset. Residual errors are generally produced as a result of encoding a digital asset using lossy compression schemes, such as vector quantization.

As used herein, "common copy compression" refers to a process of breaking down one or more digital asset data files into a single set of codebooks and individual index files corresponding to the one or more digital asset data files. Both the set of codebooks and the individual index files are smaller than the digital assets from which they were generated. As described herein, a codebook can be shared by multiple index files, whereas the index files are separate data pieces that each represent a different digital asset. In some aspects, a group of digital assets can share a codebook and have a separate index file corresponding to and representing the digital asset. One solution for compressing many digital assets with a single codebook to save storage space, among other things, has been developed by Adobe Systems, Inc., described in U.S. Pat. Nos. 9,727,234, 9,591,334, and 9,281,838, each having the title "Common Copy Compression."

A "compression ratio" generally refers to a value for determining the amount of compression applied to a digital asset. The compression ratio can be a value that is predetermined, input by an administrator, or calculated by a computing device. The compression ratio can affect the size of the codebook and/or index files produced by the common copy compression algorithm. The compression ratio can be a value, percentage, or fraction representative of an amount of compression to-be-performed by the computing device. In various embodiments, compression ratios can change based on a number of codebooks in a training set and/or a number of unique digital assets included in the training set. For example, the compression ratio can be a number on a compression scale of 1 to 10, with 1 being minimal compression resulting in a small codebook with large index files, and 10 being maximum compression resulting in a large codebook with small index files. In one aspect, a small number of unique digital assets in a codebook training set may result in a low compression ratio, while a larger number of such digital assets improves the compression ratio. Compression ratios can also be represented by percentage scales of 0% to 100%, by a fractional scale of 0/1 to 1/1, or any other representative relationship.

As used herein, the "cloud" refers to a wide area network (WAN) commonly depicted as a cloud, often referring to the Internet, and more precisely to a datacenter full of servers connected thereto. In some cases, the cloud can be the Internet, a local area network (LAN), a wide area network (WAN), or any combination thereof.

Turning now to FIG. 1, a schematic depiction is provided illustrating one exemplary operating environment 100 of which an embodiment of the present disclosure can be employed. It should be understood that this and other arrangements described herein are set forth only as examples. Other arrangements and elements (e.g., machines, interfaces, functions, orders, groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The operating environment 100 of FIG. 1 includes a digital asset supplying component 110 that communicates one or more digital assets (not shown) to a server 120 via a network 130. Each digital asset provided by the digital asset supplying component 110 includes respective content (e.g., a television show, a movie, a cartoon) and is transmitted via a corresponding avenue of digital asset communications, such as a digital television or cable channel, a live digital broadcast station, a digital asset stream, or other categorized or distinguishable avenues of communicating digital media. The digital assets can first be received by the server 120, and can be stored (e.g., recorded) in memory for one or more client devices, such as client device 180, or relayed onto the client device(s) 180 with various recording and playback options that can be performed based on instructions received from the client device(s) 180.

The server 120 includes a processing engine 140 that can process (e.g., analyze, parse, index, map) a plurality of different digital assets together, as a group, to expedite the training, and hence the generation, of a single codebook. The processing engine 140 can generate the codebook based on a codebook training set (e.g., a plurality of different digital assets), so that the codebook can be quickly trained and employed to encode digital assets having the same or common asset characteristics as those in the codebook training set. A codebook training set can include a plurality of digital assets having the same content represented differently (e.g., different bitrates, resolutions, encoding, etc.), or having different content with one or more common asset characteristics (e.g., genre, color schemes, motion vectors, etc.). In the first case, training a codebook with a codebook training set having the same content of variable representation generates a codebook that can be employed to encode any digital asset having the same content, though represented differently. In the second case, training a codebook with a codebook training set having different content with common asset characteristics generates a codebook that can be employed to encode any digital asset having content with the common asset characteristics.

For any codebook training set, the processing engine 140 processes each digital asset of the codebook training set, in parallel with one another, with a purpose of generating a single codebook. As each digital asset in the codebook training set includes either different representations of the same content (e.g., different resolutions of a movie) and/or common asset characteristics (e.g., all golf channels displaying similar colors, motion, tempo, etc.), the data of each digital asset can serve as an effective training set to generate a codebook employable to encode any digital asset that shares the commonality of the digital assets of the codebook training set. In some aspects, training a single codebook by processing a plurality of digital assets having common content and/or common asset characteristics, the codebook can be generated at a speed nearly proportional to the number of digital assets in the defined codebook training set. In this regard, and by way of example, if it takes 10 minutes to process enough of one digital asset to generate a codebook and begin an encoding process on another copy of the digital asset, it may take only 1 minute to process enough of 10 digital assets having common content and/or common asset characteristics, to generate an appropriate codebook.

The server 120 also includes a codebook and encoded asset datastore 110 that stores generated codebooks and index file for digital assets that have been encoded. For purposes of clarity, the index file for a digital asset that has been encoded (e.g., compressed) will be referred to herein as an "encoded asset." The encoded asset requires that a corresponding codebook be employed (e.g., by a decoder) to decode (e.g., decompress) the encoded asset. Inheriting the same benefits of the "common copy compression" technique described herein, the codebook and encoded assets consume significantly less storage space than conventional storage techniques that store the digital assets in a decompressed state. Moreover, latencies incurred between generation of a codebook and employment of the codebook is reduced, as the time necessary to appropriately "train" (e.g., generate) enough of the codebook to effectively compress additional assets with the same content and/or common asset characteristics is reduced based at least in part on a number of digital assets in the codebook training set.

Although the server 120 performs the described operations relating to the processing (e.g., codebook generation, encoding) of digital assets, in accordance with some embodiments, the server 120 offloads the decoding processes to one or more client devices 180 by employing a delivery component 170. The delivery component 170 communicates the encoded asset and the appropriate codebook to the client device 180 via the network 130. The delivery component 170 initializes (e.g., negotiates) one or more channels of communication with a client device 180, and transmits data streams of one or more encoded assets to the client device 180 over one or more respective channels of communication. To facilitate an off-loading of the decoding operation, the delivery component 170 embeds an appropriate codebook into one or more streams transmitted to the client device 180. Though embodiments are described where server 120 offloads the decoding process to one or more client devices 180, it is contemplated that in other embodiments, the server 120 can store, for each of the one or more client devices 180, one or more codebooks that correspond to the encoded assets stored for the client device 180. Such embodiments can be implemented to decrease processing loads associated with codebook training by having codebooks tailored for various client devices based on defined or dynamic factors, as described herein.

With a brief glance back to processing engine 140, a generated codebook can be trained based on codebook training sets having different variations of digital assets therein. Among other possible combinations, the codebook training set includes a plurality of digital assets having the same content represented differently (e.g., different bitrates, resolutions, encoding, etc.), or having different content with one or more common asset characteristics (e.g., genre, color schemes, motion vectors, etc.). Depending on system specifications and requirements, and in light of the foregoing, the method of codebook delivery may differ from one implementation to another. As such, the client device 180 can be configured to receive and employ the delivered codebook, though it is contemplated that in other embodiments, the client device 180 can receive decoded content in addition to or in lieu of encoded content with a codebook.

The client device 180 includes a receiving component 183 that initializes (e.g., negotiates) one or more channels of communication with the server device 120. The client device 180 receives the streaming transmission(s) of the encoded asset(s) via the one or more respective channels of communication, extracts codebook data from one or more of the transmitted streams, and reconstructs one or more codebooks based on the extracted codebook data. The client device 180 also includes a decoding engine 189 that employs the reconstructed codebook(s) to decode at least the received portion(s) of one or more encoded assets. It is contemplated that the decoding process is likely performed on one encoded asset based on a particular (e.g., selected) channel, but other configurations where multiple encoded assets are decoded in parallel are also considered within the purview of the present disclosure. Depending on system specifications and requirements, the decoding engine 189 may extract and reconstruct one or more appropriate codebooks for one or more encoded assets, such that the asset(s) can be decoded locally by the client device 189 to be provided for display and user consumption, among other things.

In some embodiments, the exemplary operating environment illustrated in FIG. 1 can include a plurality of client devices 180 that can request and access encoded digital assets and respective codebooks from the server device 120 over the network 130. Examples of the network 130 include, but are not limited to, Internet, local area network (LAN), wireless area network, wired area network, wide area network, and the like. A user of a client device 180 can employ various products, applications, or services supported by the client device 180 to facilitate communication to and from the server device 120. Any of these products, applications, or services can be executed directly on the client device 180 and/or accessed via the network 130 (e.g., employing an application remotely accessible by the client device and from the server device 120). Examples of the server and/or client device includes, but is not limited to, a personal computer (PC), tablet computer, a mobile computer, a smartphone, a desktop computer, a head-mounted display, a processing unit, any combination of these devices, or any other suitable device having one or more processors, also described herein with reference to FIG. 9.

In some embodiments, the digital asset supplying component 110 can include digital assets based on broadcasts, streams, source files, any other media format or real-time media, or any combination of the foregoing. In further embodiments, the digital asset supplying component 110 can include a plurality of digital asset supplying components 110, where any one is a first-party or a third-party digital asset supplying component 110. Any combination of the digital asset supplying components 110 can be coupled to the server 120 via a direct connection or via the network 130.

In some embodiments, the server 120 can provide a "cloud" storage and access service to the client devices 180, and incorporate, among other things, the processing engine 140 to process (e.g., generate codebooks from, encode) the hosted (e.g., locally stored) or incoming (e.g., broadcasted, streamed) digital assets. In some further embodiments, the server 120 can communicate one or more encoded digital asset(s) and appropriate codebook(s) in response to a request, to view the one or more digital assets, received from the client device 180.

In some further embodiments, the server 120 can also include an on-premises decoding engine (not shown), similar to the decoding engine 189 of client device 180, to decode encoded digital assets and communicate the decoded (e.g., decompressed) digital asset to client device 180 in response to a request to view the digital asset, received from the client device 180. In this regard, such embodiments may store, for each client device 180, one or more codebooks that are unique to the client device 180. A codebook stored on the server side can, in some instances, be generated based on defined user preferences and/or dynamically determined viewing history, by way of example.

In some embodiments, the server 120 can include one or more computing devices (e.g., servers) that can at least process a plurality of digital assets having common content and/or common asset characteristics, in parallel (e.g., simultaneously), to train and thereby generate one or more codebooks that can be employed quicker than conventional methods relying on a single representation of a single digital asset. In some further embodiments, the server 120 can generate multiple codebooks for a single encoded asset, with each codebook corresponding to one of a plurality of encoded asset segments. It is further contemplated that as a codebook is trained over a longer duration of time, the codebook may change. In this regard, in some embodiments, the server 120 can identify changes (e.g., a delta) to the codebook as it is trained over time, such that the identified changes can be communicated to the client device 180.

Although a portion of the description provided herein is generally directed to a processing engine 140 utilizing a compression technique based on vector quantization, it is contemplated that the described systems and methods can also incorporate other types of compression algorithms capable of encoding digital assets into a codebook and encoded assets (and residual files, in some instances).

As can be appreciated by one of ordinary skill in the art, vector quantization in compression applications comprises at least an encoder and a decoder. In simple terms, a digital asset can be broken down into input vectors. For each input vector, an encoder can read the input vector and output the index of the codeword that offers the lowest amount of distortion. In some instances, the lowest distortion is determined by calculating the Euclidean distances between the input vector and each codeword in the codebook. Upon determining the codeword with the smallest Euclidean distance, the index of that codeword is provided for recordation in an index file (e.g., an encoded asset). A decoder, on the other hand, can read the index file and replace the recorded indices with the associated codeword, thereby rebuilding the input vectors and ultimately reconstructing (e.g., decoding, decompressing) the digital asset.

In more detail, the method of compression generally begins with an encoder, where each digital asset is, in essence, a digital asset source file. The source files themselves can be in an uncompressed or a compressed state (e.g., mp4, f4v, mp3, etc.). Each source file is an input file that can be processed within a vectorizer that breaks down the input file into input vectors. Vectorization is well-known in the art of digital media compression and encoding, and additional detail will not be described herein. Utilizing a compression algorithm, such as vector quantization, each input vector is encoded or mapped to a codebook of vectors (e.g., codebook) that results in minimum error. When the input vector is encoded with the codebook, the closest codeword is found and the index of that codeword is utilized to produce parts of an index file. Upon the completion of the encoding process, all input vectors will have been encoded with at least one codebook and one index file. The codebook indices, also referred to as the index files, each represent a digital asset. By using the indices of the codebook vectors instead of the input vectors, compression can be achieved. In some instances, the encoding process can produce residual errors. The residual errors can be stored in a single residual file or in separate residual files corresponding to each index file.

In accordance with some embodiments described herein, a processing engine, such as 140 of FIG. 1, can process one or more digital assets in either a compressed or uncompressed state to train a single codebook. Generally speaking, if the digital assets are communicated in a stream, the digital assets are likely in a compressed state. The processing engine 140 can utilize a compression algorithm, such as vector quantization, to train or map each input vector to a single codebook. In some aspects, when an input vector is mapped within the codebook, the closest codeword is found and the index of that codeword is utilized to produce parts of an index file. It is contemplated that in some embodiments, it is not necessary to complete the training process of the digital assets in a codebook training set to begin utilization of the codebook. The codebook can be trained and generated while processing the input vectors of the codebook training set, or in other words "on the fly."

For example, the process of clustering input vectors to different groups based on a distance measure and choosing the centroid of that group as the codebook vector is used to train the codebook. However, in some embodiments, when a distance measure is above a certain threshold, a new codebook vector can be added. Moreover, by virtue of processing together a plurality of digital assets having common content and/or common asset characteristics, such as by processing engine 140, a sufficient portion of the codebook can be generated (e.g., trained) to effectively employ the codebook for purposes of encoding and compressing additional assets also having the common asset characteristics, or for purposes of decoding and decompressing encoded portions of the digital assets included in the codebook training set.

By way of an example application, a server device, such as server device 120, may receive a request from a client device, such as client device 180, to record (e.g., DVR) a baseball game that is currently airing live. In conventional practices, the baseball game alone would be processed for a duration to generate (e.g., train) a codebook up to an appropriate amount before the codebook can be employed to encode, compress, and store the television show. However, a processing engine 140 can immediately begin processing a plurality of different channels, such as those replaying classic baseball matchups and highlights, or even a baseball movie for example, to generate a codebook up to an appropriate amount, and in a substantially shorter timeframe than the conventional method described above.

By virtue of processing multiple digital assets having common content and/or common asset characteristics, a codebook trained therefrom can be effectively generated and employed to encode and compress similar digital assets with reduced latency. Moreover, because a plurality of digital assets are processed to train a single codebook, the digital assets can contribute a larger amount of training data to generate the codebook in a shorter period of time. Upon the completion of the codebook training process, all input vectors will have been encoded with at least one codebook. In some aspects, the generated codebook or residual files can be stored apart from or embedded into an index file, if generated, for subsequent extraction and decoding. In some other aspects, a codebook and/or residual files can be stored for each client device, based either on the encoded content stored for the client device, or based on manually or dynamically defined factors, such as viewing history or user preferences, among other things. By way of example, if a client device viewing history has a history of views relating to golf tournaments, a codebook generated based on one or more digital assets related to golf tournaments or other golf-related content may be stored for that client device. In another example, if a client device is associated with a defined user preference for golf-related content, a codebook generated based on one or more digital assets related to golf tournaments or other golf-related content may be stored for that client device.

Figure 2:
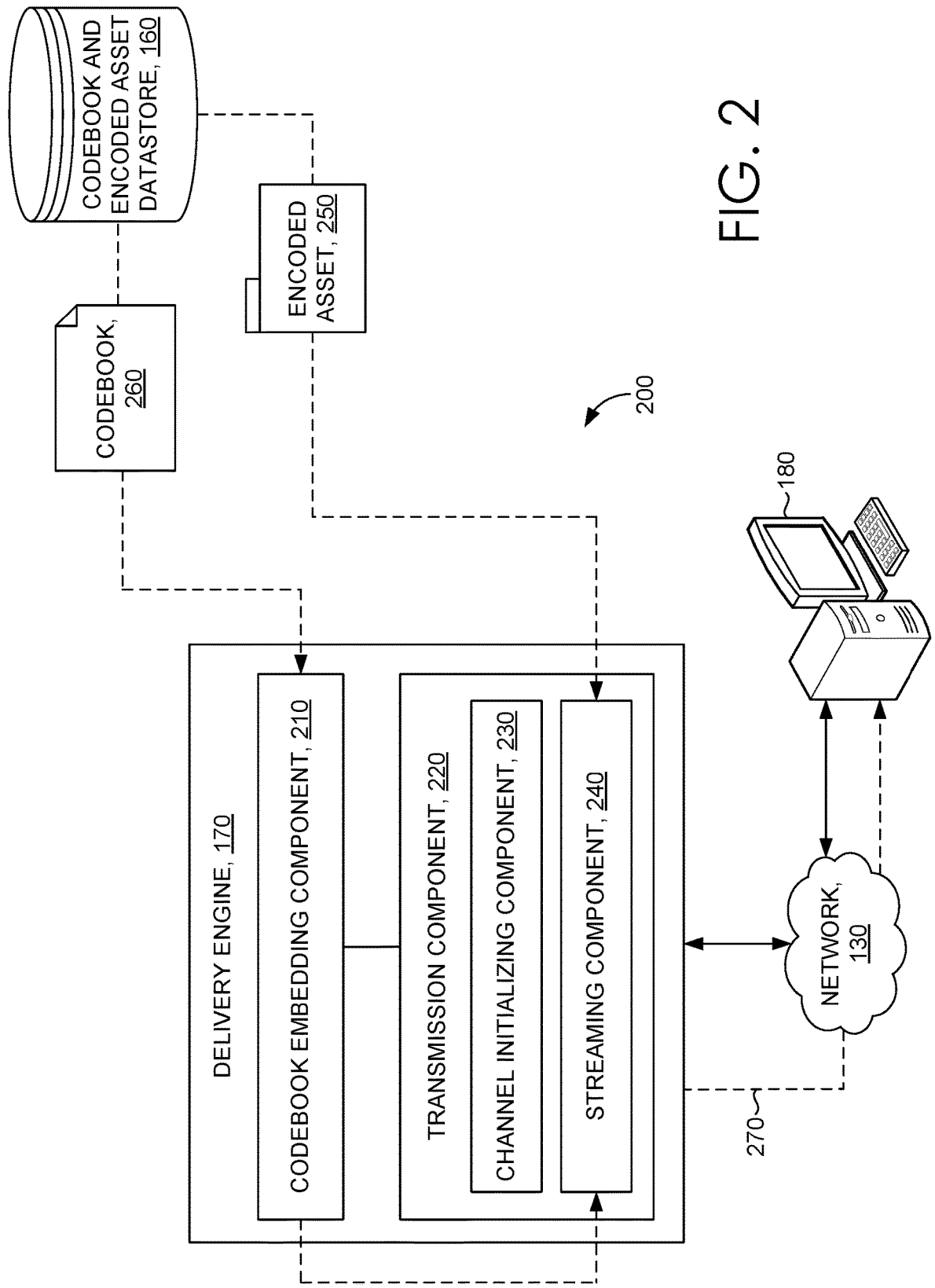
FIG. 2 is a block diagram illustrating an exemplary implementation of the processing engine in accordance with some embodiments of the present disclosure.

Referring now to FIG. 2, a block diagram 200 is provided illustrating a system component in accordance with some embodiments of the present disclosure, for optimizing resource consumption of networked media servers by offloading resource-intensive decoding tasks to the clients. The block diagram 200 depicts an exemplary implementation of the delivery component 170 described in FIG. 1, in accordance with another embodiment disclosed herein. It is noted that the depicted implementation is merely exemplary, and not intended to be limiting in any way, as each component can be arranged in various configurations, spread across a number of computing devices, combined with other components or one another, arranged to communicate over a network, or any combination of the foregoing including others not mentioned.

As described herein, one or more servers, such as server 120 of FIG. 1, can include a delivery component 170 for offloading resource-intensive decoding operations to an off-premises device, such as client device 180 of FIG. 1. The delivery component 170 can include various components, such as a codebook embedding component 210 and a transmission component 220, among other things, that can together embed and transmit one or more encoded assets 250 and corresponding codebooks 260 into one or more transmitted streams of communication to a client device 180. As described herein, delivery component 170 can facilitate the embedding of a codebook 260 into one or more streams of encoded assets that are communicated via one or more channels to the client device 180. In turn, the client device 180 can receive the transmitted stream(s) of encoded asset(s) 250, extract the relevant codebook(s) 260 for any particular channel, and employ the codebook(s) to decode one or more encoded assets received there through.

In some embodiments, and as described herein above, the processing engine 140 of FIG. 1 can obtain and process a plurality of digital assets (e.g., a codebook training set), each including a different representation (e.g., bitrate, resolution, encoding type, compression type) of the same content. As each of these digital assets are processed in tandem, a single codebook 260 is trained and generated, and at least a portion of an encoded asset 250 (e.g., index file) is generated for each of the digital assets in the codebook training set. In some aspects, the generated codebook 260 can be employed, by processing engine 140 for instance, to encode additional representations of the same content. More importantly, the generated codebook 260 can be employed by a decoding engine, such as decoding engine 189 of FIG. 1, to decode any portion of assets encoded with the generated codebook 260. Upon completion of the encoding process, whether for the entirety of the assets in the codebook training set or a portion (e.g., segment, duration) thereof, one or more of the encoded assets 250 and generated codebook 260, can be stored in a cache (not shown) or in a codebook and encoded asset data store 160 for subsequent delivery to a client device.

In the described configuration, and because the codebook 260 was trained and generated based on common content, the codebook 260 is transmitted to a client device 180 with one of the encoded assets via a single channel. The delivery component 170 can employ a transmission component 220 to facilitate the transmission, and further employ the codebook embedding component 210 to facilitate an in-stream transmission of the codebook 260. The transmission component 220 can include, among other things, a channel initializing component 230 and a streaming component 240.

The channel initializing component 230 can initialize one or more channels of communication with the client device 180. In accordance with embodiments described herein, a channel can include, among other things, a unique session or tunnel between server 120 of FIG. 1 and client device 180. A channel can include metadata that identifies a channel number, a channel source, a channel name, a channel genre or category, or any other characteristic associated with the channel or the digital assets typically transmitted there through. It is further contemplated that one or more channels can be identifiable and distinguishable in a variety of different ways not described herein, utilizing reference tables, unique identifiers, or digital signatures, by way of non-limiting examples.

When the channel initializing component 230 has initialized and established the one or more channels of communication with the client device, one particular channel 270 can be assigned to transmit (e.g., stream) the encoded asset 250 and generated codebook 260. The channel assignment can be performed in a variety of ways and need not be described in detail herein. More importantly, a particular channel 270 can be assigned to carry the streaming transmission of the encoded asset to the client device 180. The delivery component 170 can employ streaming component 240 and codebook embedding component 210 to facilitate the transmission of the encoded asset 250 and codebook 260 for offloading the decoding processes to the client device 180.

More specifically, the streaming component 240 receives the encoded asset 250 from memory, such as the cache or codebook and encoded asset datastore 160, and can begin streaming the encoded asset 250 to the client device 180 via the assigned channel 270. The codebook embedding component 210 can embed the codebook 260 into the stream while the encoded asset is transmitted via channel 270. The codebook embedding component 210 can embed the codebook 260 in a variety of ways. For instance, the codebook 260 can be embedded into the stream in accordance with the indexed portions of the encoded asset 250, such that corresponding portions of the codebook 260 referenced by the encoded asset 250 (e.g., index file) are accordingly embedded into the stream. In another instance, the encoded asset 250 can be streamed prior to or faster than the codebook 260, such that any portions of the codebook 260 referenced by the encoded asset 250 can be available for decoding upon receipt by the client device 180. It is contemplated that many implementations for embedding the codebook are within the purview of the present disclosure, while quality safeguards, such as buffers and other mechanisms for facilitating timely decoding and smooth playback can also be implemented.

Figure 3:
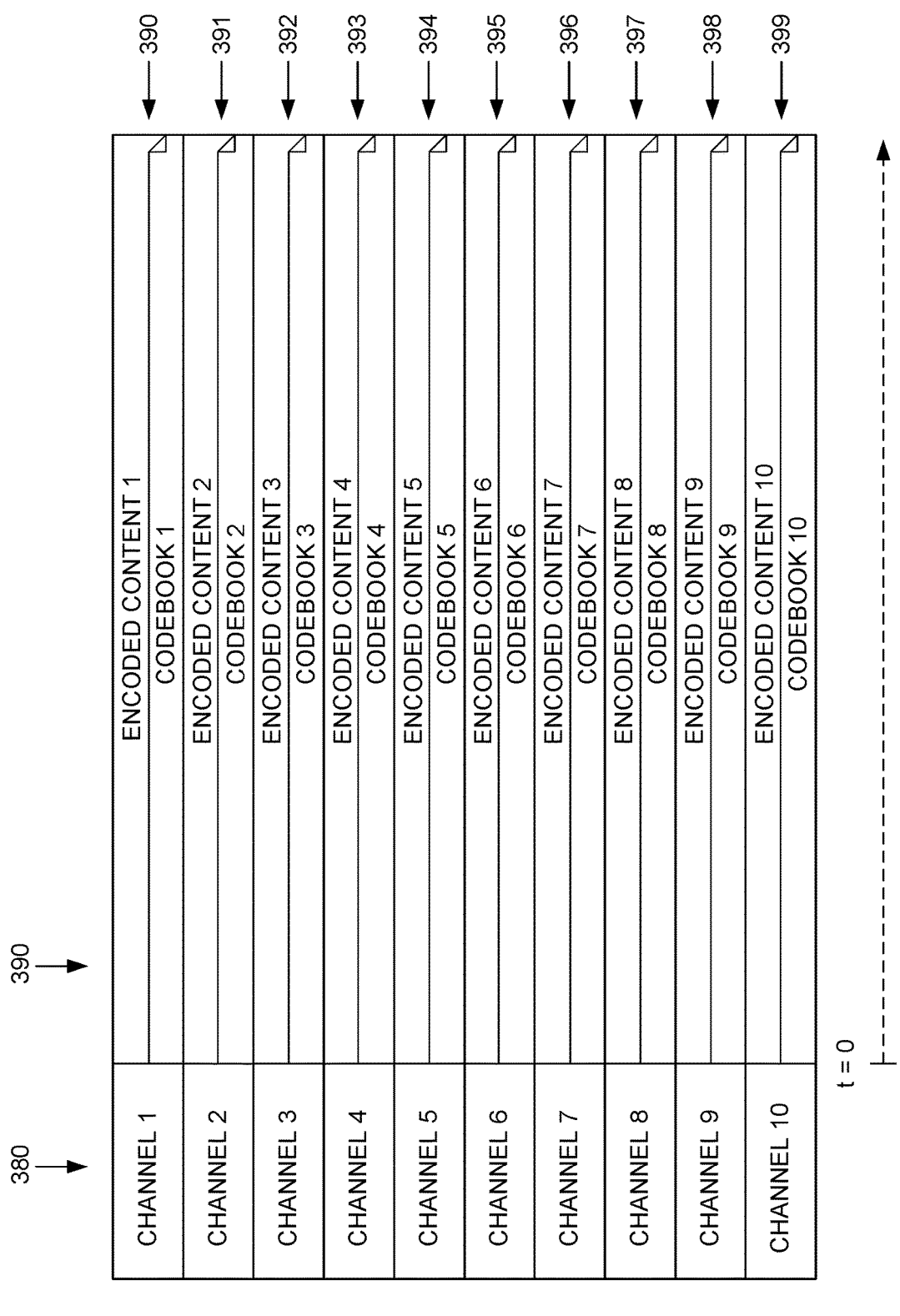
FIG. 3 is a timeline illustrating streaming channels having content-embedded codebooks in accordance with some embodiments of the present disclosure.

With brief reference to FIG. 3, a timeline 300 is provided illustrating streaming channels having stream-embedded codebooks in accordance with some embodiments of the present disclosure. The timeline 300 depicts ten different channels 380 that each include streaming transmissions 390-399 ("streams") of encoded assets or content. Each stream 390-399 includes an embedded codebook that is aligned (e.g., respectively timed) with a corresponding encoded asset, such that they are transmitted and received together. In this way, a client device, such as client device 180 of FIG. 1, can receive an encoded asset and a corresponding codebook together, and each portion of the codebook referenced by the encoded asset can be decoded together by the client device 180.

Figure 4:
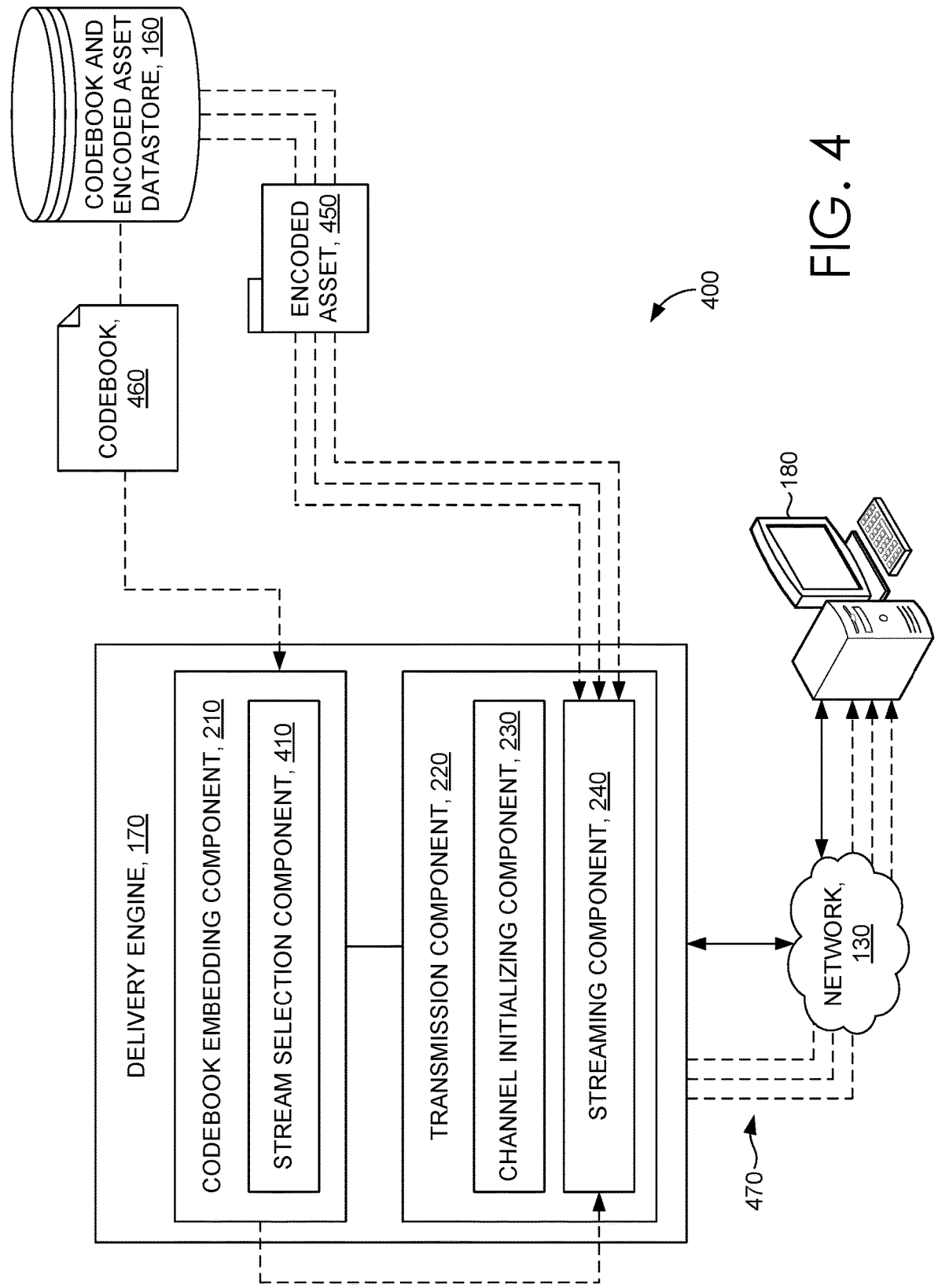
FIG. 4 is a block diagram illustrating an exemplary implementation of the processing engine in accordance with some embodiments of the present disclosure.

Referring now to FIG. 4, a block diagram 400 is provided illustrating a system component in accordance with some other embodiments of the present disclosure, for optimizing resource consumption of networked media servers by offloading resource-intensive decoding tasks to the clients. The block diagram 400 depicts an exemplary implementation of the delivery component 170 described in FIG. 1, in accordance with another embodiment disclosed herein. It is noted that the depicted implementation is merely exemplary, and not intended to be limiting in any way, as each component can be arranged in various configurations, spread across a number of computing devices, combined with other components or one another, arranged to communicate over a network, or any combination of the foregoing including others not mentioned.

In some embodiments, and as described herein above, the processing engine 140 of FIG. 1 can obtain and process a plurality of digital assets (e.g., a codebook training set), each including different content having one or more common asset characteristics, to efficiently train a single codebook. Like the configuration described in FIG. 2, each of these digital assets are processed in tandem, a single codebook 460 is trained and generated, and in some embodiments, at least a portion of an encoded asset 450 (e.g., index file) is generated for each of the digital assets in the codebook training set. If and when the training operation is completed, one or more digital assets is encoded as a separate encoded asset 450. In some aspects, the generated codebook can be employed, by processing engine 140 for instance, to encode completely different digital assets also having the one or more common characteristics as those in the codebook training set. More importantly, the generated codebook 460 can be employed by a decoding engine, such as decoding engine 189 of FIG. 1, to decode any portion of the assets encoded with the trained codebook. Upon completion of the encoding process, whether for one or more assets of the codebook training set or a portion (e.g., segment, duration) thereof, the encoded assets such as encoded assets 450, and generated codebook 460, can be stored in a cache (not shown) or in a codebook and encoded asset data store 160 for subsequent delivery to the client device 180.

In the described configuration, because the codebook 460 was trained and generated based on different digital assets having common asset characteristics, the codebook 460 can be transmitted to a client device 180 with the encoded assets via their respective channels 470. In other words, as multiple different digital assets having different content are sharing the same codebook 460, the same codebook 460 can be transmitted across multiple streaming transmissions with different encoded assets 450 each sharing the same codebook 460. As described in FIG. 2, the delivery component 170 can employ a transmission component 220 to facilitate each transmission, and further employ the codebook embedding component 210 to facilitate an in-stream transmission of the codebook 460. The transmission component 220 can include, among other things, a channel initializing component 230 and a streaming component 240.

In this configuration, the channel initializing component 230 can initialize a plurality of channels 470 of communication with a client device 180. In accordance with embodiments described herein, a channel can include, among other things, a unique session or tunnel between server 120 of FIG. 1 and client device 180 of FIG. 1. A channel can include metadata that identifies a channel number, a channel source, a channel name, a channel genre or category, or any other characteristic associated with the channel or the digital assets typically transmitted there through. It is further contemplated that one or more channels can be identifiable and distinguishable in a variety of different ways not described herein, utilizing reference tables, unique identifiers, or digital signatures, by way of non-limiting example.

When the channel initializing component 230 has initialized and established the channels of communication with the client device, each channel 470 can be assigned to transmit (e.g., stream) one of the encoded assets 450 and generated codebook 460. The channel assignment can be performed in a variety of ways and need not be described in detail herein. More importantly, the channels 470 can each be assigned to carry the streaming transmission of an encoded asset to the client device 180. The delivery component 170 can employ streaming component 240 and codebook embedding component 210 to facilitate the transmission of the encoded assets 450 and codebook 460 for offloading the decoding processes to the client device 180.

More specifically, the streaming component 240 receives the encoded assets 450 from memory, such as a cache or codebook and encoded asset datastore 160, and can begin streaming the encoded assets 450 to the client device 180 via their assigned channels 470. In some embodiments, the codebook embedding component 210 can include a stream selection component 410 that can determine whether the codebook 460 necessarily needs to be embedded across all of the encoded assets 450. In other words, if a single codebook 460 is generated and employable to decode several different encoded assets, it is reasonable to assume that the same codebook 460 does not necessarily need to be transmitted to the client device 180 more than once provided that the codebook 460 can be employed to decode another one of the encoded assets from the codebook training set if later streamed to the client device 180.

In various embodiments, the stream selection component 410 can determine whether the codebook 460 has already been transmitted to the client device 180 based on a prior transmission, whether the codebook 460 is likely to be employed by the client device 180 based on scheduled recordings, recording history, user profile information, or other indications (e.g., statistical likelihood of simultaneous recordings) that can facilitate a determination that the codebook 460 would not need to be transmitted multiple times. In some embodiments, it is also contemplated that the processing engine 140 of FIG. 1 can define a codebook training set based on digital assets that are scheduled to be recorded at the same time, such that a single codebook can be generated and transmitted once as described. Preferably, the digital assets included in the codebook training set have one or more common asset characteristics so that the compression ratio is satisfactory to maximize benefits facilitated by the encoding process.

In some embodiments, provided that the codebook 460 has not been previously transmitted to the client device 180, the codebook embedding component 210 can embed the codebook 260 into one stream as one of the encoded assets 450 is transmitted via its respective channel 470, similar to the scenario described in FIG. 2. In some other embodiments, particularly where a stream selection component 410 is not implemented and a codebook is transmitted with every encoded asset, the codebook embedding component 210 can embed the codebook 460 into each stream of the encoded assets 450 via their respective channels 470. As described with respect to FIG. 2, the codebook 460 can be embedded into a stream in accordance with the indexed portions of an encoded asset 450, such that corresponding portions of the codebook 460 referenced by the encoded asset 450 (e.g., index file) are embedded into the stream. In some instances, an encoded asset 450 can be streamed prior to or faster than the codebook 460, such that any portions of the codebook 460 referenced by the encoded asset 450 can be available for decoding upon receipt by the client device 180.

In some further embodiments, particularly when live content is being encoded and streamed from the server device 120 to the client device 180, codebook generation is preferably performed in segments. That is, periodically (e.g., every 10 seconds), a codebook is trained and generated based on incoming portions of multiple digital assets including live content (e.g., a live broadcast). Preferably, and in accordance with some embodiments described herein, each digital asset employed (e.g., the codebook training set) to train the codebook has one or more common asset characteristics to realize a suitable compression ratio.

In light of the foregoing, a new codebook can be generated for each live segment or portion for a predefined period of time. Each codebook can then be embedded into a stream with an encoded portion of the live content, similar to various embodiments described herein, so that the encoded portion can be decoded by the client device. In some implementations, a single codebook can be trained, still based on periodic portions of the live content, but continuously trained as each segment of live content is received by the encoder. In other words, new codebooks are not necessarily generated, and only a single codebook is generated and updated over time (e.g., as each segment passes). In such implementations, a single codebook can be initially-trained and generated based on initially-received portions of live content in a plurality of digital assets included in a codebook training set. The single codebook can be embedded into a stream of encoded live content communicated to client device 180 in accordance with embodiments described herein. However, any changes (e.g., a delta) to the initially-trained and generated single codebook, which were not included in the initially-trained and generated codebook already embedded into the stream, can be embedded into subsequent portions of the stream communicated to the client device 180. To this end, the client device 180 can extract the embedded codebook data (e.g., the delta) to reconstruct the initially-received codebook utilizing a locally-stored copy of the initially-trained codebook. The client device 180 can reconstruct an updated codebook utilizing the received delta embedded into the subsequent portions of the stream, and decode one or more subsequent portions of the encoded content by employing the updated codebook.

For the configurations described in FIG. 4, the compression ratio of encoded assets is likely subpar to the configuration described in FIG. 2, as the codebook 460 is generated based on different digital assets. As such, in further embodiments, the embedding and transmission of the codebook 460 over a longer duration of time relative to the encoded asset 450 can facilitate satisfactory transmission of the encoded asset and codebook, and satisfactory decoding performance by the client device 180, while maintaining the benefits of compression in various applications. As noted above, it is contemplated that many implementations for embedding the codebook are within the purview of the present disclosure, while streaming safeguards, such as buffers and other mechanisms for facilitating timely decoding and smooth playback can also be implemented.

Figure 5:
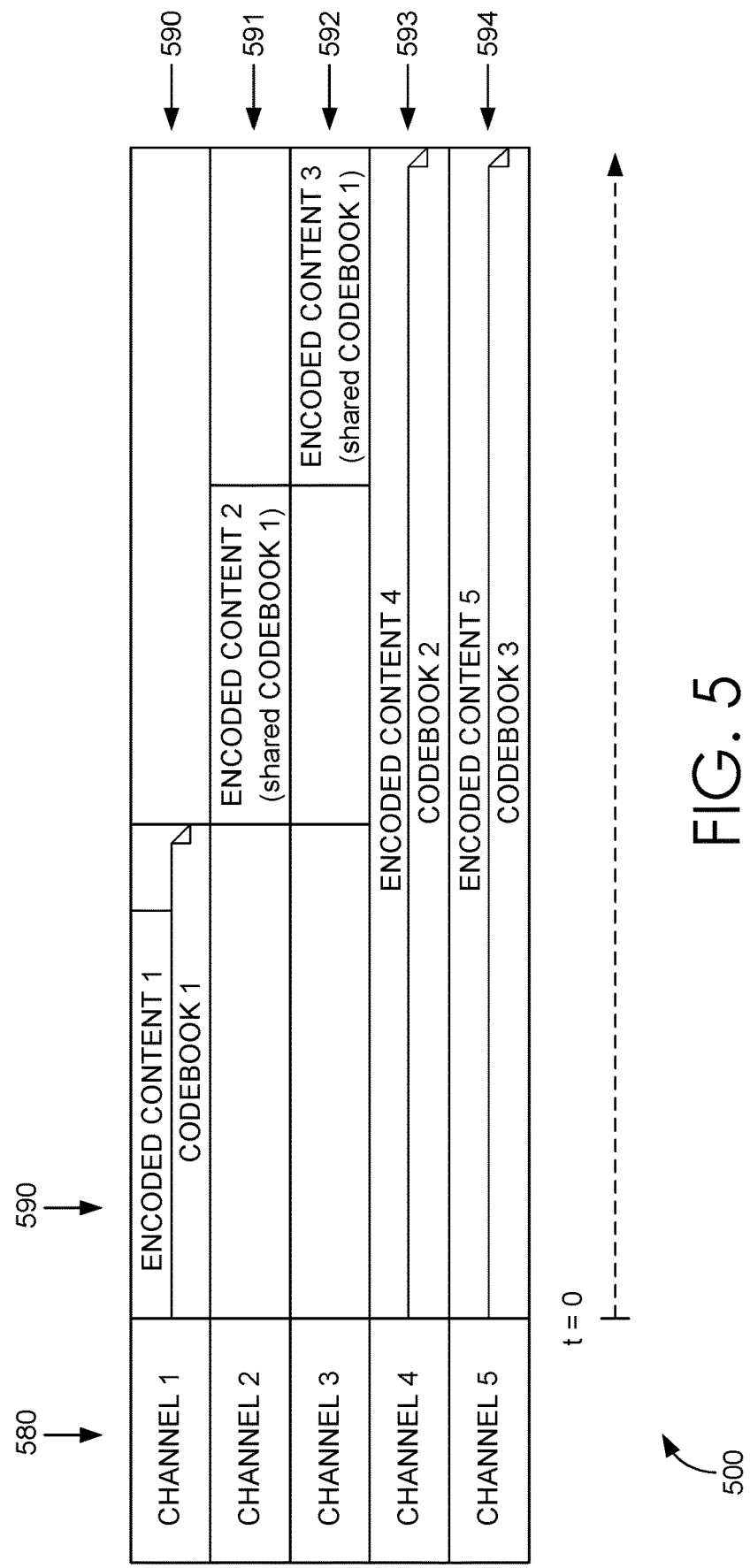
FIG. 5 is a timeline illustrating streaming channels having stream-embedded codebooks in accordance with some embodiments of the present disclosure.

With brief reference to FIG. 5, a timeline 500 is provided illustrating streaming channels having stream-embedded codebooks in accordance with some embodiments of the present disclosure. The timeline 500 depicts 5 different channels 580 that each include streaming transmissions 590-594 of encoded assets having content. Streams 593 and 594 include embedded codebooks that are aligned (e.g., respectively timed) with corresponding encoded assets (content 4 and content 5), such that they are transmitted and received together, as similarly described with respect to FIG. 3. Streams 590-592, however, depict a situation where encoded assets (content 1, content 2, and content 3) were grouped together into a single codebook training set to generate codebook 1. In accordance with some embodiments described herein, as codebook 1 was previously transmitted to the client device via the embedded stream 590, codebook 1 does not need to be transmitted to the client device for subsequent viewings or decoding of content 2 or content 3 via streams 591 and 592 respectively. Further, as depicted in stream 590 of channel 1, throughout the duration of encoded content 1, the encoded content appears to have been transmitted in a shorter duration of time relative to the duration in which codebook 1 was transmitted. In essence, the codebook 1 transmission was amortized over a longer duration to compensate for the probable inefficiencies associated with how the codebook was trained (e.g., based on different digital assets).

Figure 6:
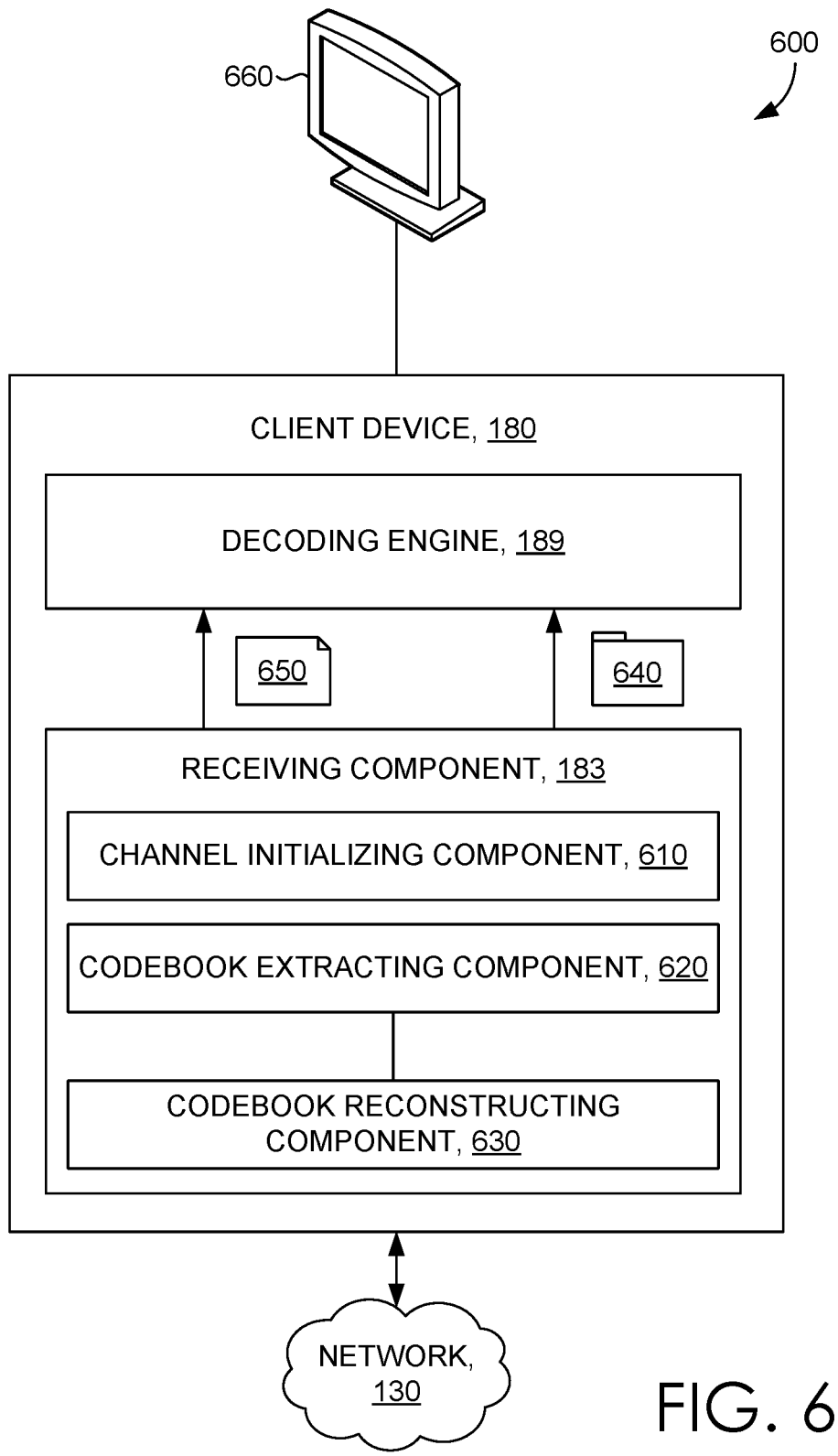
FIG. 6 is a block diagram illustrating an exemplary implementation of the receiving component in accordance with some embodiments of the present disclosure.

With reference now to FIG. 6, a block diagram is provided to illustrate an exemplary client device 180 in accordance with some embodiments of the present disclosure, that facilitates an off-premises decoding engine to off-load resource-intensive decoding processes from a server, such as server 120 of FIG. 1. The client device 180, as similar described in FIG. 1, can decode (e.g., decompress) an encoded asset, provided that an appropriate codebook that was trained based at least in part thereby, is provided to a decoding engine, such as decoding engine 189. In various embodiments, the decoding engine 189 decodes the encoded asset in response to a request generated by the client device 180, to access or view the digital asset. The request can be generated based on a request to access a particular digital asset, or can be generated based on a selected channel from a group of initialized channels, such as channels 380 of FIG. 3, 470 of FIG. 4, and 580 of FIG. 5. The decoding engine 189 can essentially reconstruct a digital asset by locating codewords in a codebook, as defined by an index (e.g., index file) of the encoded asset. It is contemplated that in some embodiments, the decoding engine 189 can include a reordering component (not shown) that essentially reverses the break down process previously performed by the vectorizer described herein above. Each vector can be reassembled into an original state (e.g., pixels, coefficients, etc.) that the digital asset was in, prior to encoding and vectorization. Ultimately, the decoding engine 189 can perform the requisite steps to decode the compressed asset into a reconstructed digital asset for presentation by a client device, such as client device 180, or a display 660 coupled thereto.

In some embodiments, the client device 180 can include, among other things, a receiving component 183 and a decoding engine 189, both of which were briefly described above with respect to FIG. 1. The receiving component 183 is, in essence, the counterpart (e.g., receiving end) of delivery component 170, described above with respect to FIGS. 1, 2, and 3, and any description provided above with respect to delivery component 170 can be considered to provide support for implementing the receiving component 183, as one of ordinary skill in the art may appreciate. The receiving component 183 receives communications from the delivery component 170, including encoded asset(s) and the appropriate codebook(s) via the network 130. The receiving component 183 initializes (e.g., negotiates) one or more channels of communication with a server device, such as server device 120 of FIG. 1, and receives data streams of one or more encoded assets over one or more respective channels of communication. To facilitate an off-loading of the decoding operation, the receiving component 183 extracts an appropriate codebook for one or more encoded asset(s) from one or more streams transmitted to the client device 180.

As was previously noted, a processing engine 140 of a server device, such as those described herein, can train and generate a single codebook based on different variations of codebook training sets. The codebook training set can include a plurality of digital assets having the same content represented differently (e.g., different bitrates, resolutions, encoding, etc.), or having different content with one or more common asset characteristics (e.g., genre, color schemes, motion vectors, etc.). Depending on system specifications and requirements, and in light of the foregoing, the method of codebook delivery may differ from one implementation to another. As such, the client device 180 is accordingly configured to receive and employ the delivered codebook.

Like the channel initializing component 230 of FIGS. 2 and 4, the client device's channel initializing component 610 can initialize one or more channels of communication with the server device 120. In accordance with embodiments described herein, a channel can include, among other things, a unique session or tunnel between server 120 and client device 180. The client device 180 can receive commands, such as requests or automated requests, that can change between the channels that the decoding engine 189 may act upon at any given time. For a selected channel, the decoding engine 189 can receive a respective streaming transmission through the selected channel. The transmission can include an encoded asset 640 or an encoded portion of a digital asset, and in some instances, codebook data embedded into the streaming transmission. In some further embodiments, the decoding engine 189 can receive multiple streams of data via multiple channels at any given time, with each channel including a respective stream of an encoded asset. In some instances, codebook data can be embedded into one or more of these streams. The client device 180 can employ a receiving component 183 to facilitate receipt of the streams, and further employ the codebook extracting component 620 to extract codebook data (e.g., pieces of the codebook) from one or more data streams communicated via their respective channels.

For any particular channel and respective stream transmitted there through, the codebook extracting component 620 can receive the incoming stream and begin extracting codebook data from the stream. As was described with respect to FIGS. 2 and 4, the codebook data can be embedded into the stream in a variety of ways, and it is similarly true that the codebook data is extracted in accordance with the method in which the codebook data was embedded by the server device 120. For instance, the codebook can be embedded into the stream in accordance with the indexed portions of the encoded asset, such that corresponding portions of the codebook referenced by the encoded asset (e.g., index file) are accordingly embedded into the stream. In another instance, the encoded asset can be streamed prior to or faster than the codebook, such that any portions of the codebook referenced by the encoded asset can be available for decoding upon receipt by the client device 180. It is contemplated that many implementations for embedding the codebook are within the purview of the present disclosure, while quality safeguards, such as buffers and other mechanisms for facilitating timely decoding and smooth playback can also be implemented by the client device 180.

In some embodiments, and in accordance with FIG. 2, a single codebook can be generated by a server device, such as server device 120, based on a codebook training set including a plurality of different digital assets (e.g., a codebook training set), each including a different representation (e.g., bitrate, resolution, encoding type, compression type) of the same content. The generated codebook can be employed by a decoding engine, such as decoding engine 189, to decode (e.g., decompress) any portion of the encoded assets from the codebook training set.

In accordance with such embodiments, because the codebook was trained and generated based on different digital assets having common content, the codebook is transmitted to the client device 180 with one of the encoded assets via a single channel. The client device 180 can employ a receiving component, such as receiving component 183, to facilitate receipt of the transmission, and further employ the codebook extracting component 620 to extract codebook data (e.g., pieces of a codebook) from a data stream communicated via the single channel. The client device 180 can further employ a codebook reconstruction component 630 that reconstructs the codebook based at least in part on the extracted codebook data.

In more detail, and in accordance with FIG. 4, a single codebook can be generated on a server device, such as server device 120, based on a codebook training set including a plurality of different digital assets, each including different content having one or more common asset characteristics (e.g., content, genre, category, source channel, color scheme, motion vectors, etc.). The generated codebook can be employed by a decoding engine, such as decoding engine 189, to decode any portion of the encoded assets from the codebook training set. In accordance with such embodiments, because the codebook was trained and generated based on different digital assets having common asset characteristics, the codebook can be transmitted to the client device 180 with the encoded assets via their respective channels. In other words, as multiple different digital assets having different content are sharing the same single codebook, the single codebook can be transmitted across multiple streaming transmissions with different encoded assets each sharing the same codebook. In some embodiments, the single codebook only need be transmitted across a single streaming transmission with a single encoded asset, so that the codebook can be locally-stored by the client device 180 and employed to decode another encoded asset that shares the same codebook.

When the codebook data is extracted, the client device 180 can further employ the codebook reconstruction component 630 to reconstruct the codebook 650 based at least in part on the extracted codebook data. In some embodiments, a codebook 650 can be reconstructed by employing an index or other header information (e.g., metadata) included in and also extracted from the stream and/or encoded asset, which defines the order in which the codebook is to be structured. In some other embodiments, the codebook can be reconstructed based on a time that the codebook data is received respective to a portion of the stream or data received (e.g., index file, encoded asset), or relative to a time the respective portion was received.

In some other embodiments, the codebook can be reconstructed based on a locally-stored codebook that was reconstructed based on codebook data received earlier in time. That is, when codebook data is extracted from one or more earlier-received segments of a particular stream and utilized to reconstruct a codebook, additional codebook data that is extracted later in the stream (e.g., relative to the earlier-received segments) can include modifications to the already-reconstructed codebook. In other words, instead of a new codebook being embedded, transmitted as codebook data in a stream, and received to reconstruct a new codebook for one or more segments transmitted via the stream, codebook data can include modifications or "updates" to an already-reconstructed codebook. In such embodiments, it is contemplated that as codebook training modifies a codebook on the server side as codebook training progresses, such modifications can be embedded into a stream and transmitted from the server device 120 to the client device 180. To this end, the client device 180 can extract the codebook data and reconstruct (e.g., modify) a locally-stored codebook utilizing the codebook modifications derived from the extracted codebook data to update the codebook accordingly.

Figure 7:
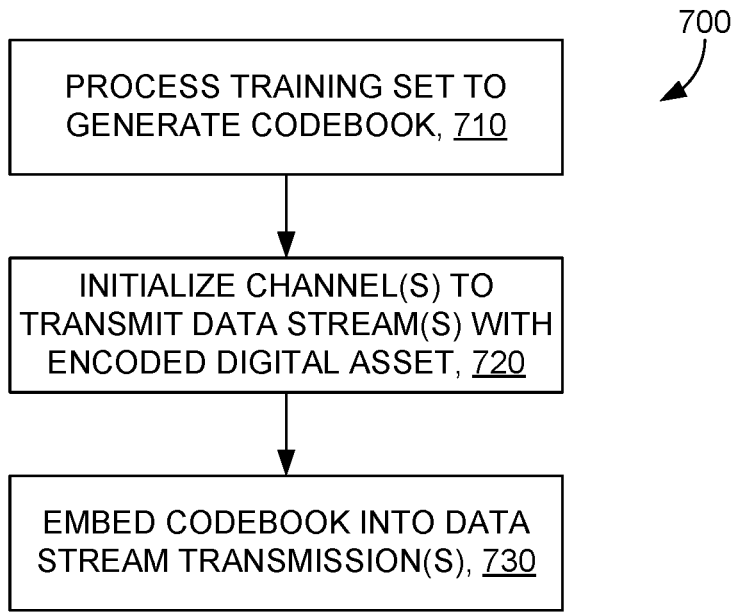
FIG. 7 illustrates a process flow depicting an example method for embedding codebooks to offload content-decoding resources in accordance with some embodiments of the present disclosure.

Looking now to FIG. 7, a flow diagram is provided showing an example process flow 700 for optimizing computing resources on a cloud-based media server—by embedding codebooks into streaming transmissions to offload decoding processes to an off-premises client device. In FIG. 7, a codebook training set is obtained by a processing engine, such as processing engine 140 of FIG. 1. As described herein, the codebook training set can include a plurality of digital assets.

Depending on implementation, the plurality of digital assets can be configured in variable arrangements. In an embodiment, each digital asset in the plurality of digital assets includes a different representation of a common content. That is, each digital asset includes the same content, but the content in each digital asset is represented by a different bitrate, resolution, encoding method, compression method, codec, or any other form or method for representing common content. In another embodiment, each digital asset in the plurality of digital assets includes different content, but having one or more common asset characteristics. That is, each digital asset includes content that is different from content of the other digital assets in the codebook training set. However, each digital asset and/or corresponding content can have one or more asset characteristics that are determinable or identifiable, for instance by processing engine 140 of FIG. 1, as being common (e.g., the same).

In some embodiments, the codebook training set can be defined by the processing engine. In some further embodiments, the processing engine can define the codebook training set based on determined asset characteristics. At least a portion of each digital asset in the plurality of digital assets of the codebook training set is processed 710 by the processing engine. The processing of the codebook training set generates a single codebook based on the codebook training set, an encoded portion (e.g., an index file) for each digital asset in the training set, and in some cases a residual file for each digital asset in the codebook training set. As described herein, each encoded portion can be representative of one of the plurality of digital assets in the codebook training set. In some aspects, the residual file can be embedded into the encoded asset or the generated codebook, or similarly, a portion of the residual file can be embedded into a portion of the encoded asset or a portion of the generated codebook.

One or more channels of communication ("channels") are initialized 720 between a server device, such as server device 120 of FIG. 1, and a client device, such as client device 180, to facilitate communications from the server device to the client device and, in some instances, to also facilitate communications from the client device to the server device. However, some or all communications are not necessarily limited to initialized channel(s) and can be enabled through other means, such as one or more secured network connections or sessions initialized in the same or similar manner.

The channel(s) can facilitate an ongoing connection between the server and client devices, such that a data stream can be transmitted there through, from the server device to the client device. A data stream, in accordance with embodiments described herein, can include one or more encoded portions of a digital asset. In this regard, the data stream includes at least an encoded (e.g., compressed) portion of a digital asset. In some instances, the encoded asset can already be encoded with the same or another compression algorithm, and as such, the data stream can include at least an encoded portion of an already-compressed digital asset.

The codebook generated based on the training set is embedded 730 into the data stream of one or more channels established between the server device and the client device. In other words, a stream of an encoded asset transmitted via a channel, from the server device to the client device, can be injected with the codebook data associated with the corresponding codebook that was generated based on the codebook training operation 710. In other words, the codebook data is embedded into the stream. In some instances, the codebook data is the generated codebook or a portion thereof. In some other instances, the codebook data includes one or more modifications to a codebook that already exists on the client device.

In more detail, and in accordance with an embodiment described herein, codebook data can be transmitted via the stream with at least a first encoded portion of a digital asset. This codebook data can be extracted by the client device to reconstruct or regenerate the embedded codebook or embedded codebook portion. Subsequently-received codebook data can include one or more changes to the codebook based on the codebook training process 710 described above over a period of time extending beyond a period during which the first encoded portion was generated. In this regard, the client device can reconstruct or modify the earlier reconstructed codebook utilizing the subsequently-received codebook data. The client device, as will be described with respect to FIG. 8, can then decode one or more received encoded portions of the digital asset streamed via the channel.

Figure 8:
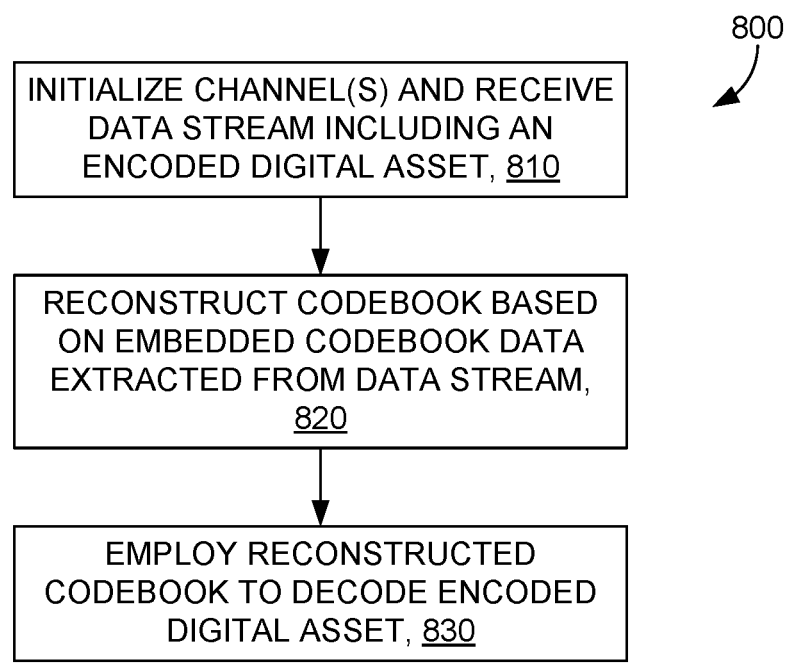
FIG. 8 illustrates a process flow depicting an example method for employing embedded codebooks to offload content-decoding resources in accordance with some embodiments of the present disclosure.

Looking now to FIG. 8, a flow diagram is provided showing an example process flow 800 for optimizing computing resources on a cloud-based media server—by embedding codebooks into streaming transmissions to offload decoding processes to an off-premises client device. In FIG. 8, one or more channels of communication ("channels") are initialized 810 between a client device, such as client device 180, and a server device, such as server device 120 of FIG. 1, to facilitate communications from the server device to the client device and, in some instances, to also facilitate communications from the client device to the server device. However, some or all communications are not necessarily limited to initialized channel(s) and can be enabled through other means, such as one or more secured network connections or sessions initialized in the same or similar manner.

The channel(s) can facilitate an ongoing connection between the server and client devices, such that a data stream can be transmitted there through, from the server device to the client device. A data stream, in accordance with embodiments described herein, can include one or more encoded portions of a digital asset. In this regard, the data stream includes at least an encoded (e.g., compressed) portion of a digital asset. In some instances, the encoded asset can already be encoded with the same or another compression algorithm, and as such, the data stream can include at least an encoded portion of an already-compressed digital asset.

As described herein with respect to FIG. 7, a codebook generated based on the training set can be embedded into the data stream of one or more channels established between the server device and the client device. In other words, a stream of an encoded asset transmitted via a channel, from the server device to the client device, can be injected with the codebook data associated with the corresponding codebook that was generated based on the codebook training operation 710. In other words, the codebook data is embedded into the stream. In some instances, the codebook data is the generated codebook or a portion thereof. In this regard, the client device can extract the embedded codebook data with a codebook extracting component, such as codebook extracting component 620 of FIG. 2. The extracted codebook data is then processed by a codebook reconstructing component, such as codebook reconstructing component 630 of FIG. 6, to reconstruct 820 the codebook or codebook portion that was embedded into the stream. The reconstructed codebook or codebook portion can be employed 830 by a decoding engine, such as decoding engine 189 of FIGS. 1 and 6, of the client device to decode and decompress the encoded asset. Once decoded, the client device 180 can provide for display the decoded asset or asset portion on a display 660 coupled to the client device 180.

In some other instances, the codebook data includes one or more modifications to a codebook that already exists on the client device. In more detail, and in accordance with an embodiment described herein, codebook data can be transmitted via the stream with at least a first encoded portion of a digital asset. This codebook data can be extracted by the client device to reconstruct or regenerate the embedded codebook or embedded codebook portion corresponding to the first encoded portion of the digital asset. Subsequently-received codebook data can include one or more changes to the codebook based on the codebook training process 710 described above over a period of time extending beyond a period during which the first encoded portion was generated. In this regard, the client device can reconstruct or modify the earlier reconstructed codebook utilizing the subsequently-received codebook data can then decode one or more received encoded portions of the digital asset streamed via the channel.

Moreover, based on how the codebook was trained and generated before it was embedded into a stream, in one embodiment, the codebook may have been embedded into multiple streams received via multiple channels. In another embodiment, however, the codebook may have been embedded only into a single stream for multiple encoded assets that are intended to share the codebook. In this regard, the receiving component 183 can determine that the codebook is intended for multiple encoded assets and store the codebook for subsequent employment. This determination can be made in various ways, by way of analyzing metadata associated with the codebook, analyzing a recording history associated with the client device, analyzing a recording schedule associated with the client device, a viewing history associated with the client device, a user profile associated with the client device, or even a determined likelihood that the codebook will be employed for another compatible encoded asset based on any of the foregoing factors in a non-limiting way.

Figure 9:
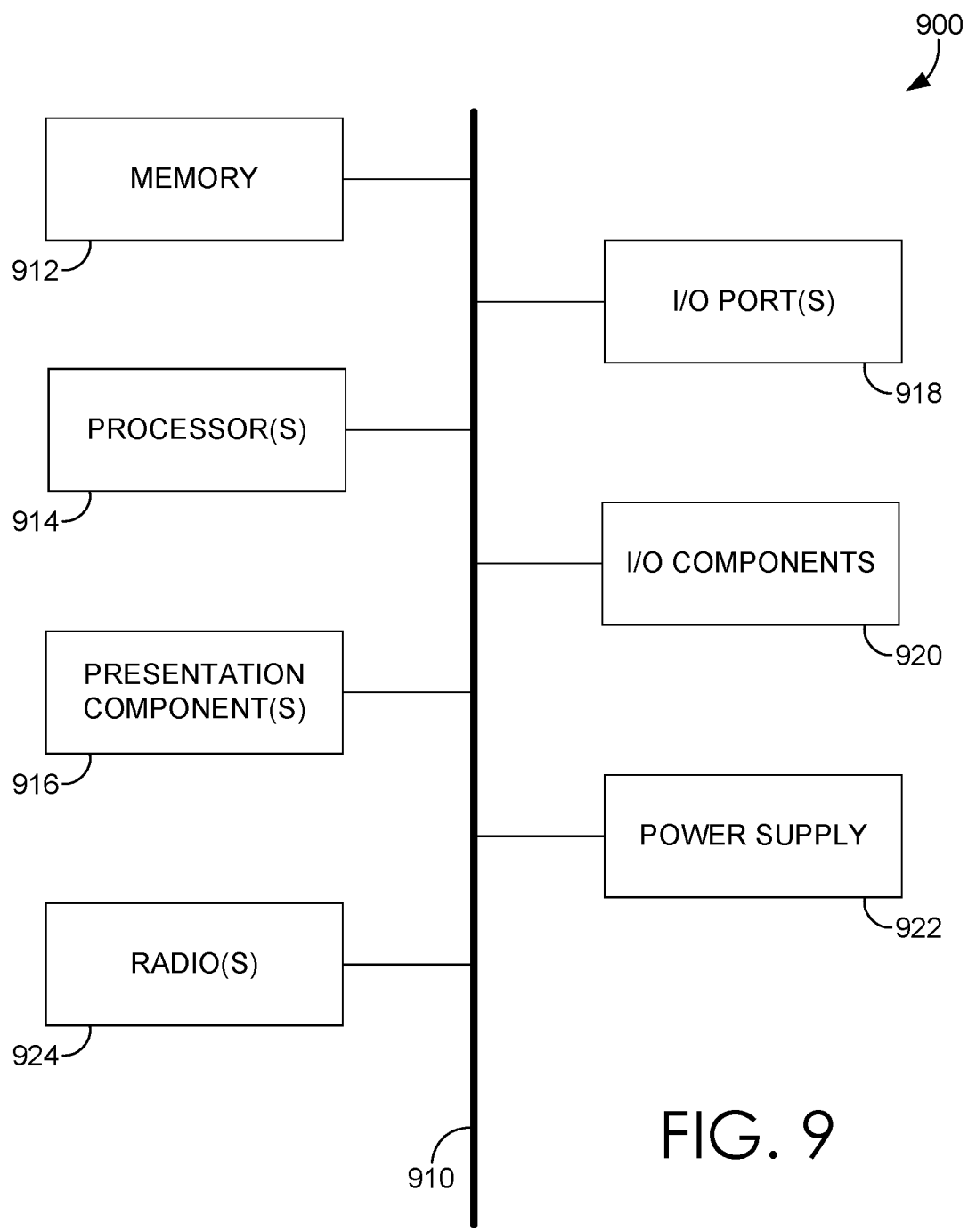
FIG. 9 is a block diagram of an example computing device in which some embodiments of the present disclosure may be employed.

Having described embodiments of the present disclosure, an exemplary operating environment in which embodiments of the present disclosure can be implemented is described below in order to provide a general context for various aspects of the present disclosure. Referring to FIG. 9, an illustrative operating environment for implementing embodiments of the present disclosure is shown and designated generally as computing device 900. Computing device 900 is but one example of a suitable computing environment and is not intended to suggest any limitation as to the scope of use or functionality of the invention. Neither should the computing device 900 be interpreted as having any dependency or requirement relating to any one or combination of components illustrated.

Embodiments of the present disclosure can be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. Embodiments of the present disclosure may be practiced in a variety of system configurations, including hand-held devices, consumer electronics, general-purpose computers, more specialty computing devices, etc. Embodiments of the present disclosure may also be practiced in distributed computing environments where tasks are performed by remote-processing devices that are linked through a communications network.

With reference to FIG. 9, computing device 900 includes a bus 910 that directly or indirectly couples the following devices: memory 912, one or more processors 914, one or more presentation components 916, input/output (I/O) ports 918, input/output components 920, and an illustrative power supply 922. Bus 910 represents what may be one or more busses (such as an address bus, data bus, or combination thereof). Although the various blocks of FIG. 9 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventor recognizes that such is the nature of the art, and reiterates that the diagram of FIG. 9 is merely illustrative of an exemplary computing device that can be used in connection with one or more embodiments of the present disclosure. Distinction is not made between such categories as "workstation," "server," "laptop," "hand-held device," etc., as all are contemplated within the scope of FIG. 9 and reference to "computing device."

Computing device 900 typically includes a variety of computer-readable media. Computer-readable media can be any available media that can be accessed by computing device 900 and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 900. Computer storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 912 includes computer-storage media in the form of volatile and/or nonvolatile memory. The memory may be removable, non-removable, or a combination thereof. Exemplary hardware devices include solid-state memory, hard drives, optical-disc drives, etc. Computing device 900 includes one or more processors that read data from various entities such as memory 912 or I/O components 920. Presentation component(s) 916 present data indications to a user or other device. Exemplary presentation components include a display device, speaker, printing component, vibrating component, etc.

I/O ports 918 allow computing device 900 to be logically coupled to other devices including I/O components 920, some of which may be built in. Illustrative components include a microphone, joystick, game pad, satellite dish, scanner, printer, wireless device, etc. The I/O components 920 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 900. The computing device 900 may be equipped with depth cameras, such as stereoscopic camera systems, infrared camera systems, RGB camera systems, touchscreen technology, and combinations of these, for gesture detection and recognition. Additionally, the computing device 900 may be equipped with accelerometers or gyroscopes that enable detection of motion. The output of the accelerometers or gyroscopes may be provided to the display of the computing device 900 to render immersive augmented reality or virtual reality.

Embodiments presented herein have been described in relation to particular embodiments which are intended in all respects to be illustrative rather than restrictive. Alternative embodiments will become apparent to those of ordinary skill in the art to which the present disclosure pertains without departing from its scope.

From the foregoing, it will be seen that this disclosure in one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

In the preceding detailed description, reference is made to the accompanying drawings which form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the preceding detailed description is not to be taken in a limiting sense, and the scope of embodiments is defined by the appended claims and their equivalents.

Various aspects of the illustrative embodiments have been described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features have been omitted or simplified in order not to obscure the illustrative embodiments.

Various operations have been described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, descriptions of operations as separate operations should not be construed as requiring that the operations be necessarily performed independently and/or by separate entities. Descriptions of entities and/or modules as separate modules should likewise not be construed as requiring that the modules be separate and/or perform separate operations. In various embodiments, illustrated and/or described operations, entities, data, and/or modules may be merged, broken into further sub-parts, and/or omitted.

The phrase "in one embodiment" or "in an embodiment" is used repeatedly. The phrase generally does not refer to the same embodiment; however, it may. The terms "comprising," "having," and "including" are synonymous, unless the context dictates otherwise. The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)."

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A non-transitory computer storage medium storing computer-useable instructions that, when used by at least one computing device, cause the at least one computing device to perform operations to offload decoding resources to off-premises client devices comprising:

training a codebook with at least a portion of each digital asset of a plurality of digital assets, wherein the codebook is trained to decode at least an encoded portion of a first digital asset in the plurality of digital assets; and amortizing an embedding of the codebook into a first data stream as the first data stream is transmitted to an off-premises client device, wherein the first data stream includes the encoded portion of the first digital asset, and the amortized codebook is embedded into the first data stream at a first rate that is slower than a second rate at which the first data stream is transmitted, wherein the off-premises client device is configured to employ portions of the embedded codebook received via at least the first data stream to decode corresponding encoded portions of the first digital asset received via the first data stream.

2. The non-transitory computer storage medium of claim 1, wherein the plurality of digital assets includes different representations of a common content.

3. The non-transitory computer storage medium of claim 2, wherein a representation of the common content includes at least one of a resolution, a bitrate, and an encoding type or scheme.

4. The non-transitory computer storage medium of claim 1, wherein the plurality of digital assets includes different pieces of content having at least one common asset characteristic.

5. The non-transitory computer storage medium of claim 4, wherein an asset characteristic includes one of a content, a content genre, a content category, a content title, a content source, a content resolution, a content bitrate, a content encoding type, a content encoding source, a content entropy coding scheme, a content compression type, a content codec, a content motion vector schema, a group of pictures (GOP), a sequence structure, or a frame relationship.

6. The non-transitory computer storage medium of claim 1, wherein a second data stream is transmitted to the off-premises device including at least an encoded portion of a second digital asset in the plurality of digital assets.

7. The non-transitory computer storage medium of claim 6, wherein the codebook is further embedded into the second data stream as the second data stream is transmitted to the off-premises client device, and wherein the off-premises client device is further configured to employ the received portions of the embedded codebook to decode corresponding encoded portions of the second digital asset received via the second data stream.

8. The non-transitory computer storage medium of claim 1, the operations further comprising:
selecting at least the first data stream in which to embed the codebook based on at least one of a recording history associated with the off-premises client device, a recording schedule associated with the off-premises client device, a viewing history associated with the off-premises client device, and an encoding record that associates the codebook with the plurality of digital assets.

9. The non-transitory computer storage medium of claim 1, wherein the off-premises client device is further configured to extract the embedded codebook from at least the first data stream as at least the first data stream is received.

10. A computerized system for offloading decoding resources to off-premises client devices comprising:
at least one processor; and
at least one computer storage media storing computer-usable instructions that, when used by the at least one processor, cause the at least one processor to:
receive at least a first data stream from a remote computing device, wherein a codebook that was generated based at least in part on an encoding of a first digital asset is amortized and embedded into at least the first data stream and received at a first rate that is slower than a second rate at which the first data stream is received;
reconstruct a portion of the codebook based at least in part on a received amortized portion of the embedded codebook data extracted from at least the first data stream; and
employ the reconstructed portion of the codebook to decode at least a corresponding encoded portion of the first digital asset received via the first data stream.

11. The system of claim 10, wherein the codebook was generated based further in part on an encoding of at least a second digital asset having a different representation of a content that is common to the first digital asset.

12. The system of claim 11, wherein the reconstructed portion of the codebook is employable to decode at least the corresponding encoded portion of the first digital asset as either representation of the common content.

13. The system of claim 10, wherein the codebook was generated based further in part on an encoding of at least a second digital asset having content that is different than the first digital asset, and at least one asset characteristic that is common to the first digital as set.

14. The system of claim 10, wherein the received amortized portion of the embedded codebook is further extracted from a second data stream received from the remote computing device, and wherein the codebook was generated based further in part on an encoding of a second digital asset.

15. The system of claim 14, wherein the codebook is amortized and embedded into at least the first data stream and the second data stream, so that the reconstructed portion of the codebook is employable to decode at least the corresponding encoded portions of the first and second digital assets.

16. The system of claim 10, wherein the instructions further cause the one or more processors to:
determine that the reconstructed portion of the codebook extracted from the first data stream is employable to decode a corresponding encoded portion of a second digital asset received from the remote computing device via a second data stream; and
employ the reconstructed portion of the codebook to decode at least the corresponding encoded portion of the second digital asset.

17. The system of claim 10, wherein the received portion of the embedded codebook is extracted from at least the first data stream at a first rate that is slower than a second rate at which at least the first data stream is received.

18. The system of claim 10, wherein the embedded codebook includes a modification to a locally-stored codebook, and wherein at least a portion of the codebook is reconstructed based on the locally-stored codebook and the received portion of the embedded codebook.

19. An encoded content and codebook delivery system comprising:
a transmitting means for transmitting, at a first rate at least a first data stream to a remote client device, the first data stream being adapted to communicate an encoded digital asset to the remote client device;
a codebook embedding means for amortizing and embedding, at a second rate slower than the first rate, codebook data into at least the first data stream as the encoded digital asset is communicated to the remote client device, wherein the embedded codebook data was generated based at least in part on an encoding of the digital asset; and
a decoding means for employing at least a portion of the embedded codebook data received via at least the first data stream to decode at least a corresponding portion of the encoded digital asset received via the first data stream.

* * * * *